(12) United States Patent
Lok

(10) Patent No.: US 11,757,459 B2
(45) Date of Patent: Sep. 12, 2023

(54) CASCODE CLASS-A DIFFERENTIAL REFERENCE BUFFER USING SOURCE FOLLOWERS FOR A MULTI-CHANNEL INTERLEAVED ANALOG-TO-DIGITAL CONVERTER (ADC)

(71) Applicant: Caelus Technologies Limited, Hong Kong (HK)

(72) Inventor: Chi Fung Lok, Hong Kong (HK)

(73) Assignee: Caelus Technologies Limited, Hong Kong (HK)

( * ) Notice: Subject to any disclaimer, the term of this patent is extended or adjusted under 35 U.S.C. 154(b) by 44 days.

(21) Appl. No.: 17/673,947

(22) Filed: Feb. 17, 2022

(65) Prior Publication Data

US 2023/0261661 A1 Aug. 17, 2023

(51) Int. Cl.
*H03M 1/00* (2006.01)
*H03M 1/06* (2006.01)

(52) U.S. Cl.
CPC ......... *H03M 1/002* (2013.01); *H03M 1/0604* (2013.01)

(58) Field of Classification Search
CPC .......... H03F 3/505; H03F 2203/45722; H03F 3/005; H03F 3/45475; H03F 1/26; H03F 1/34; H03F 2200/372; H03F 2200/453; H03F 2203/45134; H03F 2203/45136; H03F 2203/45512; H03F 2203/45628; H03M 1/46; H03M 1/124; H03M 1/0863; H03M 1/08; H03M 1/38; H03M 1/804; H03M 1/0604; H03M 1/0809; H03M 1/1009; H03M 1/1023; H03M 1/1215; H03M 1/1245; H03M 1/145; H03M 1/164; H03M 1/742; H03M 1/745; G05F 3/262; G05F 3/30; G05F 1/575; G05F 1/56; G05F 1/577; G05F 1/595; G05F 3/16; G05F 3/222; G05F 3/24; G05F 3/242

USPC ........ 341/155, 142, 139, 172, 161, 134–136
See application file for complete search history.

(56) References Cited

U.S. PATENT DOCUMENTS

| | | | |
|---|---|---|---|
| 6,337,647 B1 * | 1/2002 | Masson | H03M 1/0863 341/150 |
| 6,407,622 B1 * | 6/2002 | Opris | G05F 3/30 327/539 |
| 6,586,980 B1 * | 7/2003 | Callahan, Jr. | G05F 3/262 327/134 |
| 7,327,166 B2 | 2/2008 | Zanchi et al. | |

(Continued)

*Primary Examiner* — Linh V Nguyen
(74) *Attorney, Agent, or Firm* — gPatent LLC; Stuart T Auvinen

(57) ABSTRACT

A reference buffer has many legs each with an upper transistor, a lower transistor, and a resistor or current source as a tail device in series. The source or emitter of the upper (lower) transistor generates an upper (lower) reference voltage. This source follower transistor configuration has a low output impedance and high current. The gate or base of the upper (lower) transistors are driven by a first (second) control node. A control leg has an upper transistor, a lower transistor, and a tail device in series. The source and gate, or emitter and base, are connected together for the upper and lower transistors and generate the upper and lower control nodes. Alternately, the gate or base of the upper (lower) transistor is driven by an op amp receiving an upper (lower) bandgap voltage and the upper (lower) control node as negative feedback.

20 Claims, 14 Drawing Sheets

(56) References Cited

U.S. PATENT DOCUMENTS

| | | | | |
|---|---|---|---|---|
| 7,471,139 B2* | 12/2008 | Khalid | ............... | H03F 1/342 |
| | | | | 327/541 |
| 8,902,093 B1* | 12/2014 | Leuciuc | ............ | H03M 1/1245 |
| | | | | 341/172 |
| 9,397,682 B2 | 7/2016 | Dinc et al. | | |
| 9,891,650 B2* | 2/2018 | Motozawa | ............. | G05F 3/30 |
| 10,359,799 B2* | 7/2019 | Jang | .................. | G05F 3/16 |
| 2006/0202876 A1 | 9/2006 | Lee | | |
| 2008/0136694 A1* | 6/2008 | Imai | ............... | H03M 1/0604 |
| | | | | 341/144 |
| 2008/0297234 A1* | 12/2008 | Moholt | .............. | G05F 3/262 |
| | | | | 327/541 |
| 2009/0079471 A1 | 3/2009 | Cheng | | |
| 2009/0153234 A1* | 6/2009 | Bhuiyan | ............. | G05F 3/26 |
| | | | | 327/538 |
| 2010/0214013 A1* | 8/2010 | Shibayama | ........... | G05F 3/30 |
| | | | | 327/539 |
| 2011/0018520 A1* | 1/2011 | Imura | .............. | G05F 3/24 |
| | | | | 323/311 |
| 2012/0169305 A1* | 7/2012 | Kwon | .............. | G05F 3/24 |
| | | | | 323/268 |
| 2012/0266055 A1* | 10/2012 | Zhang | ............. | G06F 11/0754 |
| | | | | 714/E11.024 |
| 2018/0275710 A1* | 9/2018 | Ono | ................ | G05F 3/30 |
| 2019/0079553 A1* | 3/2019 | Jang | ................. | H03K 17/567 |
| 2019/0222203 A1* | 7/2019 | Tripoli | ............... | G05F 1/577 |
| 2021/0349490 A1* | 11/2021 | Krishnan | .......... | H03F 3/45179 |

* cited by examiner

US 11,757,459 B2

CASCODE CLASS-A DIFFERENTIAL REFERENCE BUFFER USING SOURCE FOLLOWERS FOR A MULTI-CHANNEL INTERLEAVED ANALOG-TO-DIGITAL CONVERTER (ADC)

FIELD OF THE INVENTION

This invention relates to reference voltage buffers, and more particularly to parallel source-follower high-speed reference buffers for interleaved Analog-to-Digital Converters (ADCs).

BACKGROUND OF THE INVENTION

Analog-to-Digital Converters (ADC) are widely used in many applications. Some applications require both high precision and high sampling speed. High precision can be achieved using multi-bit ADC's, such as 8-bits to 12-bits of precision. A very precise voltage reference is also needed. A bandgap reference can provide such precision, however, the bandgap reference cannot directly provide the low impedance and higher currents needed for a higher-speed ADC. A reference buffer may be added to buffer the bandgap references to provide a low impedance, high current drive reference.

FIG. 1A shows a prior-art ADC with a reference buffer. Differential analog input buffer 14 receives a differential analog voltage Ainp, Ainn that is buffered to drive differential voltage inputs Vinp, Vinn to ADC 100. ADC 100 compares the differential input voltage to reference voltages Vrefp, Vrefn to determine digital code DCODE that is equivalent to this input voltage with a +/−0.5 LSB quantization error according to the resolution of ADC. The higher the resolution, the smaller the quantization error.

Bandgap reference generator 102 uses a bandgap device to generate reference voltages Vrp, Vrn. The current drive from bandgap reference generator 102 is not sufficient to directly drive the voltage reference inputs to ADC 100 because high-speed operation of ADC 100 requires very fast charging and discharging of array capacitors by the voltage references.

Reference buffer 10 receives the bandgap reference voltages Vrp, Vrn and buffers them using higher-drive circuits to generate Vrefp, Vrefn that are input to ADC 100.

FIG. 1B shows a capacitor array in an ADC that requires high currents from reference voltage inputs. Converter 101 has a weighted array of capacitors 20, 26, 28 that share charge to the inputs to comparator 12 that generates a digital bit VCOMP that is 1 when the + input to comparator has a higher voltage than the − input.

A controller or sequencer (not shown) controls switches 16, 18 that allow various voltages to be switched to the outer or top plates of capacitors 20, 26, 28. Each switch can be individually controlled. A Successive-Approximation (SA) routine may be used to switches successively smaller capacitors on or off to test different digital values to see which digital value is closest to the analog input voltage.

For example, converter 101 may be initialized by setting all switches 16, 18 to connect a common-mode voltage VCM to the outer plates of all capacitors 20, 26, 28. The + and − input lines to comparator 12 may also be driven to VCM by equalizing switches (not shown). VCM can be generated as a midpoint between the reference voltages, such as (Vrefp−Vrefn)/2, using a 1:1 resistor divider.

Then in a sampling phase the true analog voltage Vinp may be applied by switches 16, 18 to the outer plates of all capacitors 20, 26 that have inner (bottom) plates connected to the + input of comparator 12, while the complement analog voltage Vinn is applied by switches 16, 18 to the outer plates of all capacitors 20, 28 that have inner plates connected to the − input of comparator 12. VCM is applied to both inputs of comparator 12. The differential analog input voltage is thus sampled into the plates of capacitors 20, 26, 28.

Next, during an evaluation phase switches 16, 18 drive VCM to all output plates, but a Successive-Approximation routine test successively smaller capacitors that are driven with the reference voltage rather than with VCM.

For example, when the Most-Significant Bit (MSB) capacitors 26, 28 are being tested, upper switch 18 connects reference Vrefn to the outer plate of MSB capacitor 26, while lower switch 18 connects reference Vrefp to the outer plate of MSB capacitor 28. This switching causes charge sharing and charges to be shifted between MSB capacitors 26, 28 and the + and − input lines to comparator 12, which may flip the digital output VCOMP. The SA routine can watch VCOMP for the flip and set to clear bits in a Successive-Approximation-Register (SAR) as a result. By testing successively smaller capacitors 20, the SA routine can fill the SAR with a good approximation of the analog input voltage.

Although the voltage references Vrefp, Vrefn do not drive any DC loads, and thus do not have to have a large DC current, these reference voltages have to transfer charge to and from capacitors 26, 28 when testing the MSB capacitors. Since the MSB capacitors can be large, there may be a significant amount of charge to transfer. For higher speed ADCs, there are limits to the time available to transfer this charge. Bandgap reference generator 102 cannot quickly provide this charge, so reference buffer 10 is needed to provide low impedance, high-current drive voltage references Vrefp, Vrefn.

High speed and precision ADCs require the error made when comparing to the references to be less than ½ LSB for every sampling time period Ts. Reference buffer 10 is required to not only operate at a high speed but also to have a ripple error of less than ½ LSB. Signal-dependent and Power/Ground supply rejection are other considerations for high speed, high-precision ADCs. In addition, if the ADC is a time-interleaved ADC, sub-ADC channel crosstalk may require that reference buffer 10 provide a lower impedance and higher currents to quickly suppress this crosstalk.

The ADC may operate with a very low power supply voltage, such as 1 volt. Then Vrefp and Vrefn must fit within this 1-volt range, such as by being set to 0.75 and 0.25 volt. Reference buffer 10 must be able to operate with the low-overhead power-supply voltage.

High-speed operation of the ADC requires that reference buffer 10 have a high current drive at low impedance to be able to quickly drive charges to capacitors 20, 26, 28 during the evaluation phase or quantization. High sampling rates may also be achieved by interleaving the ADC, or using parallel capacitor arrays and converters. These parallel capacitor arrays for interleaving further increase the charge that must be driven by reference buffer 10.

Although high currents are needed to quickly move the reference charges, low power operation is still desirable. What is desired is a reference buffer circuit for a high-speed interleaved ADC. A low-impedance reference buffer with a small ripple error and low output noise is desired. A high Power-Supply Rejection Ratio (PSRR) is desired for a reference buffer that uses the ADC's reduced power-supply voltage. A reference buffer that is less prone to power supply variations is desirable. A parallel reference buffer for driving parallel sub-ADCs in a multi-channel interleaved ADC is desirable.

DETAILED DESCRIPTION

The present invention relates to an improvement in ADC reference buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
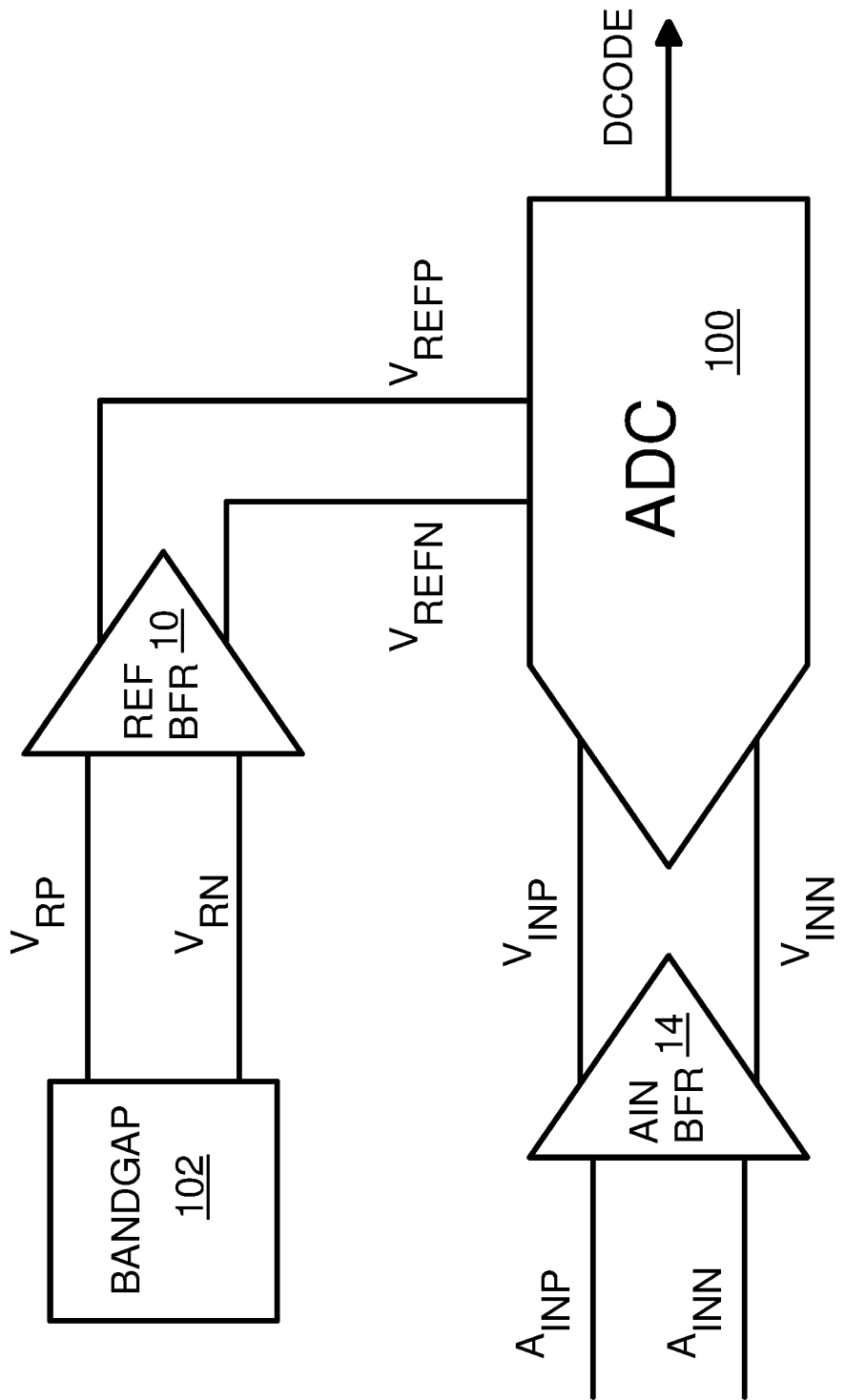
FIG. 1A shows a prior-art ADC with a reference buffer.
Figure 1B:
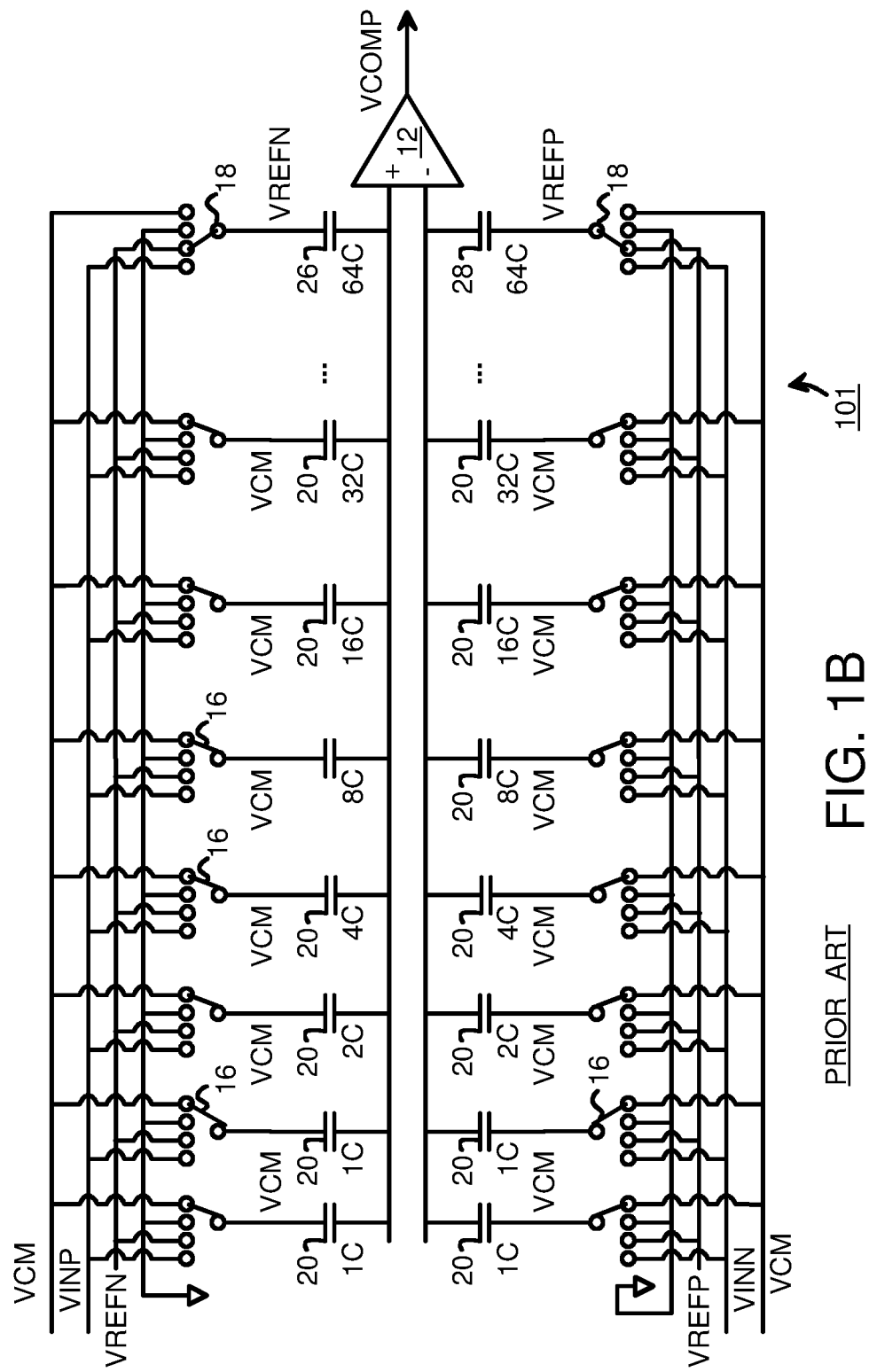
FIG. 1B shows a capacitor array in an ADC that requires high currents from reference voltage inputs.
Figure 2:
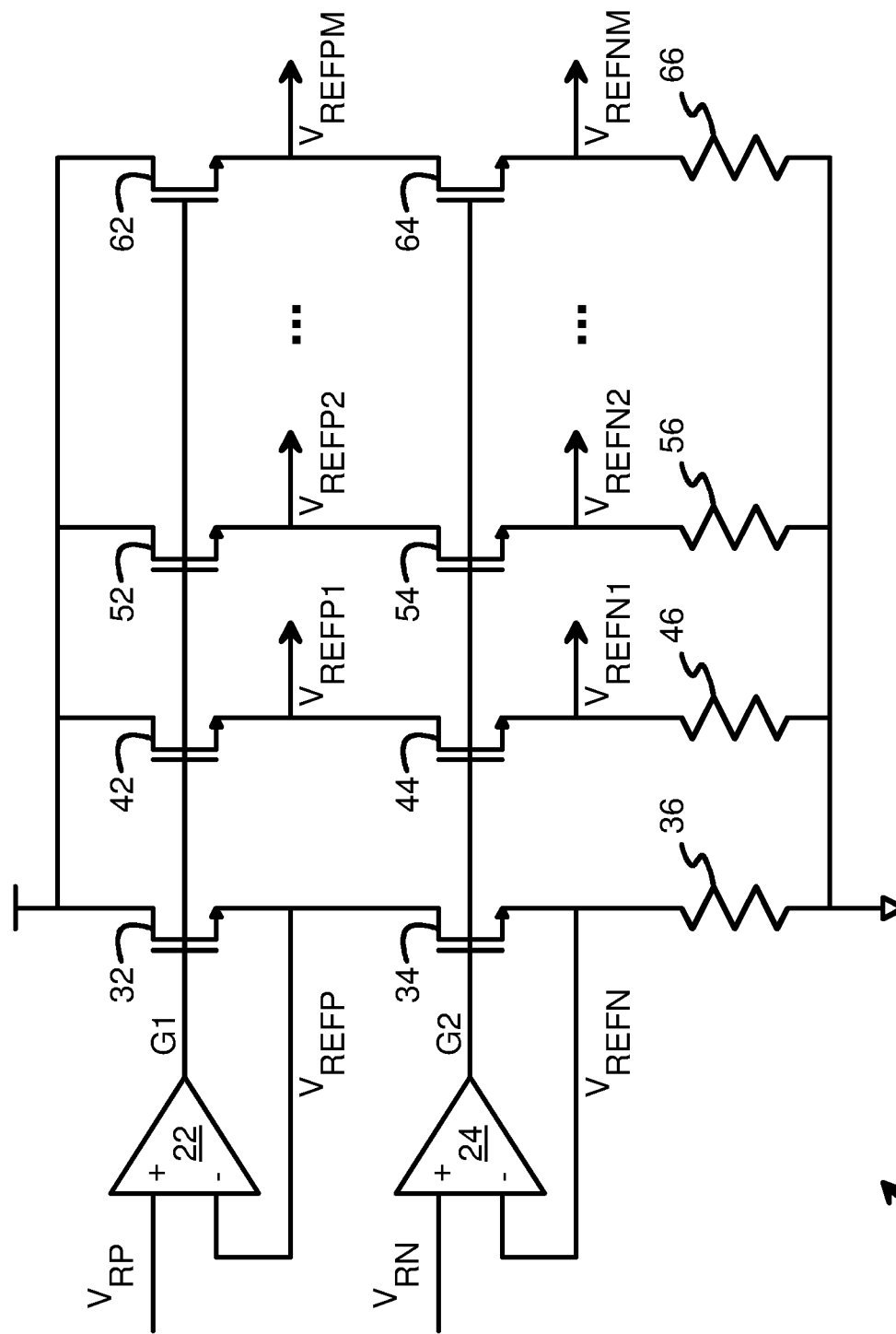
FIG. 2 is a schematic of a parallel multi-channel cascode Class-A differential reference buffer.

FIG. 2 is a schematic of a parallel multi-channel cascode Class-A differential reference buffer. Bandgap reference voltage Vrp is applied to the non-inverting + input of op amp 22 while the inverting – input of op amp 22 is driven by the source of transistor 32.

Transistor 32 is an n-channel Metal-Oxide-Semiconductor Field-Effect Transistor (MOSFET) that has its drain driven by the power supply VDD, its gate driven by the output by op amp 22, node G1, and its source generating the reference Vrefp. Transistor 32 is connected as a source-follower, with the Vrefp output generated by its source rather than its drain.

Source followers provide a low output impedance and high current drive. The negative feedback of op amp 22 further reduces the output impedance of the source follower, transistor 32.

The lower reference, Vrefn, is also generates by a source follower. NMOS transistor 34 has its drain connected to the upper reference Vrefp, and its source generates the lower reference Vrefn, which is fed back to the inverting – input of op amp 24. Op amp 24 receives the lower bandgap reference Vrn on its non-inverting + input, and generates node G2 to the gate of transistor 34. Tail resistor 36 connects the source of transistor 34, Vrefn, to ground.

Two source follower n-channel transistors 32, 34 in series generate references Vrefp, Vrefn that have a low impedance and high current drive due to their source-follower configuration and the negative feedback to op amps 22, 24.

While reference nodes Vrefp, Vrefn generated by a first leg of source follower transistors 32, 34 provide a high current, this current can be mirrored to many parallel legs of source follower pairs to provide many parallel voltage references.

A second leg of source follower transistors 42, 44 and tail resistor 46 generate a second pair of voltage references Vrefp1, Vrefn1. The gate of transistor 42 is driven by gate node G1 output by op amp 22, while the gate of transistor 44 is driven by gate node G2 output by op amp 24, so source follower transistors 42, 44 benefit from the negative feedback in the first leg. Disturbances on its outputs Vrefp1, Vrefn1 cannot disturb this feedback in leg 1. Better isolation and signal rejection can be achieved using parallel legs.

In the third leg, source follower transistor 52 received gate node G1 generated in the first leg, and has a source driving reference Vrefp2 that is also the drain of source follower transistor 54. Gate node G2 drives the gate of source follower transistor 54. The source of source follower transistor 54 drives a high current to reference Vrefn2 with low impedance. Trail resistor 56 biases the source of transistor 54.

Many other legs of source follower transistors 62, 64 and tail resistor 66 can be added, each having an upper source follower transistor 62 with a gate receiving G1 and a source driving the upper reference Vrefpm to one or more of the ADC channels. Each leg also has a lower source follower transistor 64 with a gate receiving G2 and a source driving the lower reference Vrefnm to the ADC channel.

Reference buffer 10 uses source follower transistors to provide high current, low impedance upper and lower voltage references. The voltage references are generated in parallel and can drive parallel ADC channels with reduced cross-talk.

Figure 3:
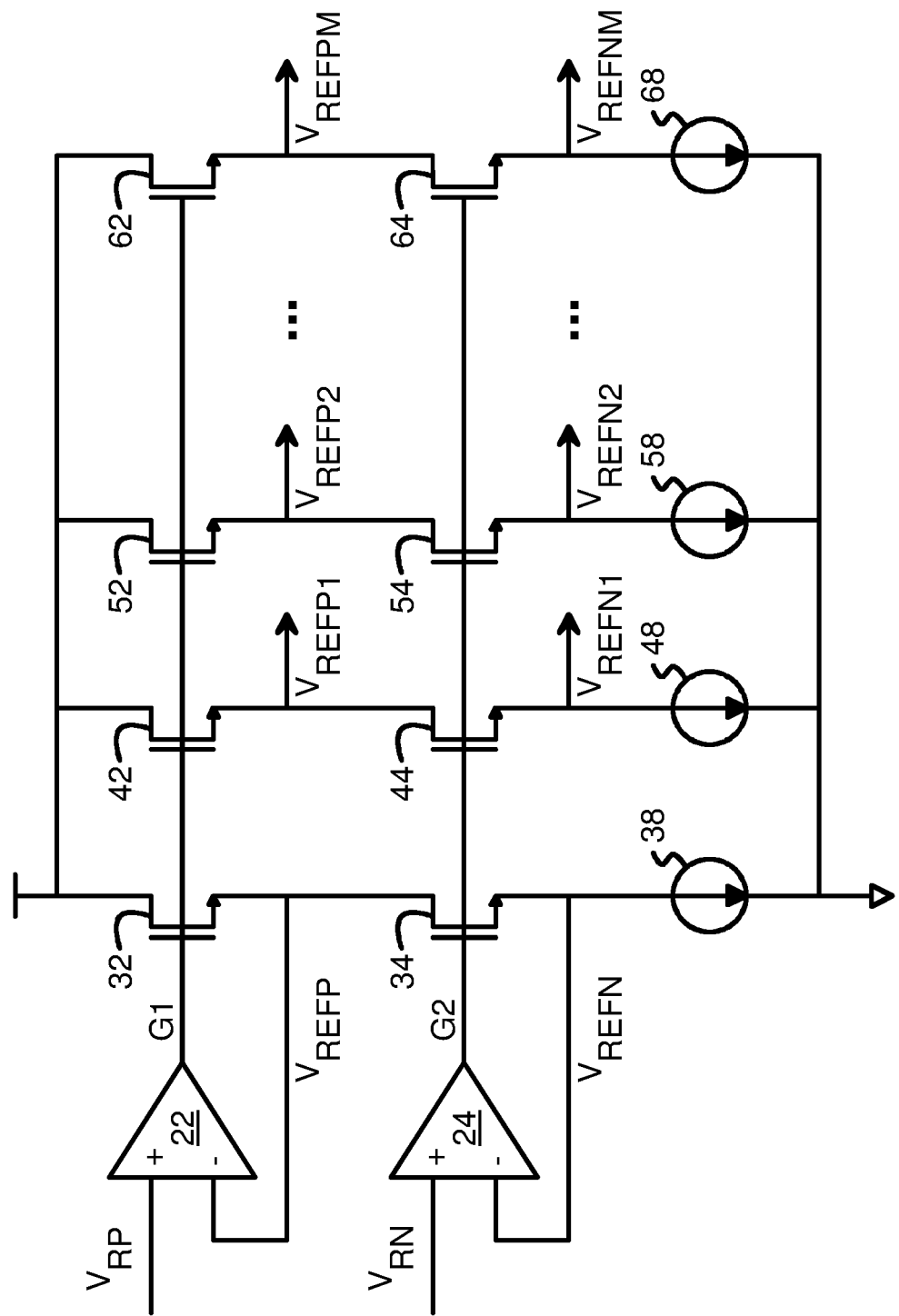
FIG. 3 shows tail current sources in the parallel multi-channel cascode Class-A differential reference buffer.

FIG. 3 shows tail current sources in the parallel multi-channel cascode Class-A differential reference buffer. In this alternative to the reference buffer of FIG. 2, tail current source 38 replaces tail resistor 36. Likewise, tail current sources 48, 58, 68 replace tail resistors 46, 56, 66 in the parallel legs.

Replacing tail resistor 36 with tail current source 38 provides a constant tail current rather than a tail current that depends on the lower reference voltage Vrefn and the ground voltage. Better ground ripple rejection can be achieved. The output impedance of source-follower transistor 34 is suppressed further by op amp 24 since the impedance of the current source is higher. Tail current source 38 can be implemented with a n-channel transistor with its drain connected to Vrefn, and a gate driven by a bias voltage such as generated by a simple diode-connected n-channel transistor.

Figure 4:
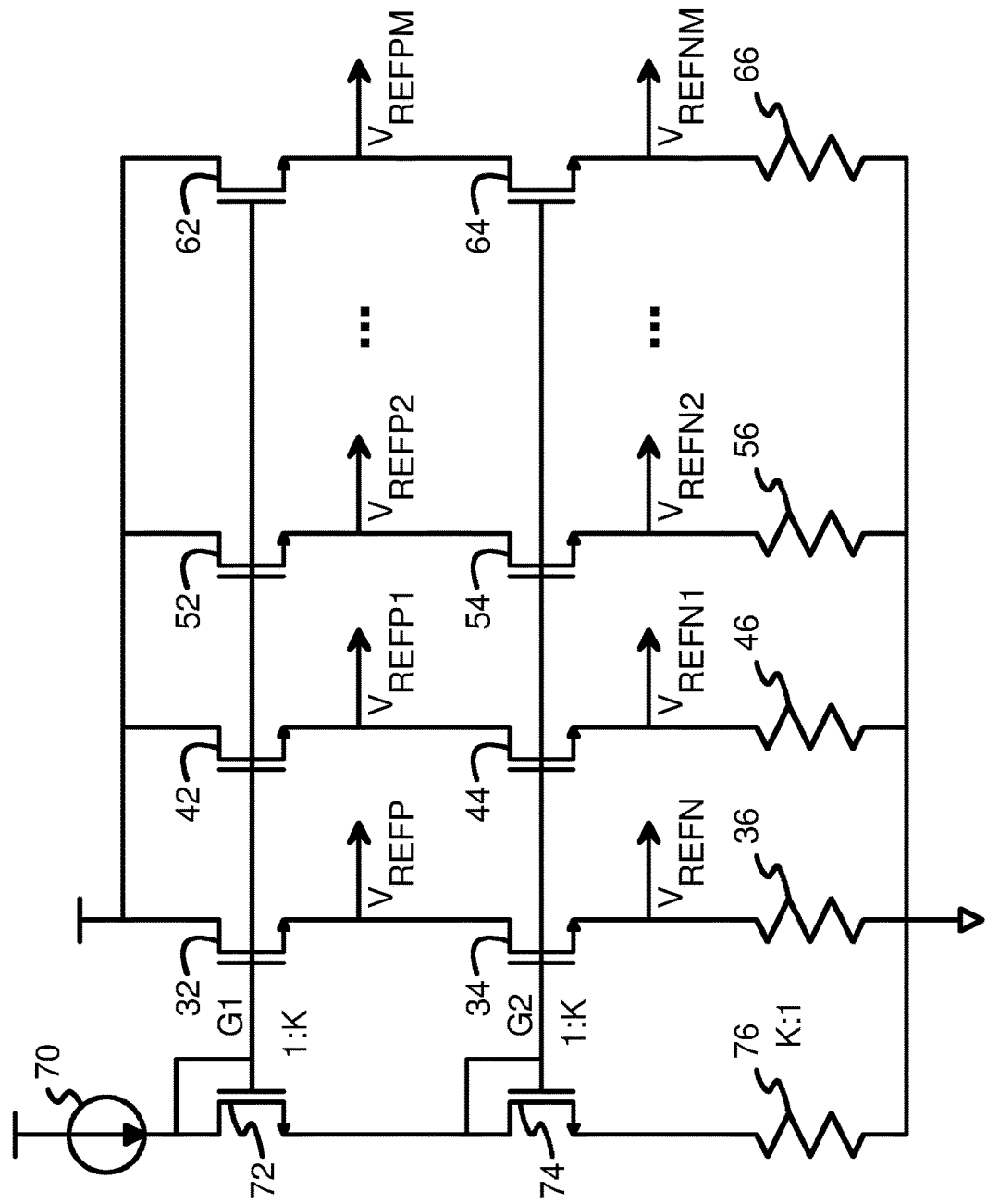
FIG. 4 is a schematic of a self-biasing parallel multi-channel cascode Class-A differential reference buffer.

FIG. 4 is a schematic of a self-biasing parallel multi-channel cascode Class-A differential reference buffer. Rather than use bandgap reference generator 102, internal voltage references are generated in a self-biasing leg.

The self-biasing leg has current source 70 connected to the power supply to drive the drain of n-channel transistor 72, which has its gate and drain connected together. As current is forced through transistor 72 by current source 70, the gate/drain voltage rises above the source voltage to turn on transistor 72 and generate a bias voltage on its gate/drain node G1.

The source of transistor 72 connects to the drain and gate of transistor 74, which also generates a lower bias voltage on its gate/drain node G2. Tail resistor 76 between the source of transistor 74 and ground generates a source voltage due to the IR drop as current flows through the self-biasing leg.

Gate nodes G1, G2 are thus directly generated from transistors 72, 74 in the self-biasing leg. Vrefp can then be generated at the source of source follower transistor 32 in the first leg, while Vrefn is generated at the source of source follower transistor 34 by the tail current flowing through tail resistor 36.

Other parallel legs of source follower transistors and tail resistors generate other pairs of references. Vrefp2 is generated at the source of source follower transistor 52 while Vrefn2 is generated at the source of source follower transistor 54. Vrefpm is generated at the source of source follower transistor 62 while Vrefnm is generated at the source of source follower transistor 64.

This is simple circuit implementation without the need for a bandgap reference and an op amp in a loop. This can be used for applications wherein the ADC does not need an accurate reference voltage range but accepts a range of reference voltages (such as 0.3V-0.6V). This greatly reduces the power consumption and the area of circuit to be used in the reference buffer. The disadvantages are a relatively higher DC output impedance and a lower power-supply ground rejection on the reference voltages. Power/area or cost can be traded off with performance. High speed SerDes may use such a realization for the reference buffer.

The sizes of the transistors and resistors can be ratioed among legs to have different currents in the different legs. For example, the self-biasing leg can have a lower current than in the parallel legs that generate the voltage references to the ADC. When size of transistor 72 in the self-biasing leg is normalized to 1, then the size of transistors 32, 42, 52, 62 can be K, where K is a whole number such as 8. Then the current drive of transistor 32 driving Vref1 is K times the current drive of transistor 72.

Tail resistors can also be ratioed, but self-biasing leg tail resistor 76 is K times the resistance of each of tail resistor 36, 46, 56, 66. The lower resistance values allows for more current to flow in the parallel legs than in the self-biasing leg.

Figure 5:
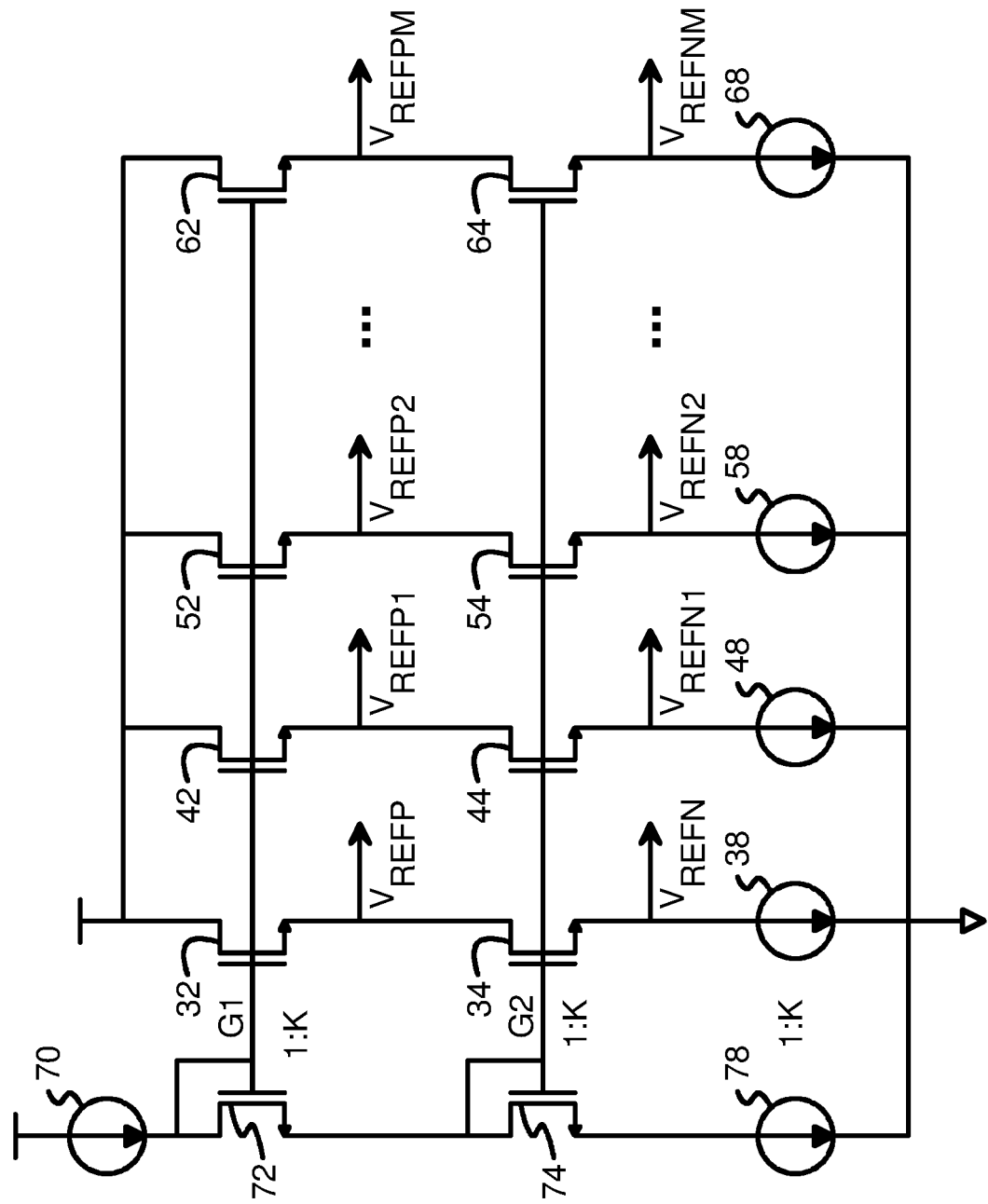
FIG. 5 shows tail current sources in the self-biasing parallel multi-channel cascode Class-A differential reference buffer.

FIG. 5 shows tail current sources in the self-biasing parallel multi-channel cascode Class-A differential reference buffer. In this alternative to the reference buffer of FIG. 4, tail current source 38 replaces tail resistor 36. Likewise, tail current sources 48, 58, 68 replace tail resistors 46, 56, 66 in the parallel legs. In the self-biasing leg, tail current source 78 replaces tail resistor 76.

Replacing tail resistor 76 with tail current source 78 provides a constant tail current rather than a tail current that depends on the lower source voltage and the ground voltage. Better ground ripple rejection can be achieved. The output impedance of source-follower transistors 34, 44, 54, 64 can be smaller when current sources 48, 58, 68 are used. Tail current source 78 can be implemented with a n-channel transistor with its gate receiving a bias voltage from a diode-connected transistor.

The sizes of the transistors and current sources can be ratioed among legs to have different currents in the different legs. For example when current from tail current source 78 in the self-biasing leg is normalized to 1, then the current of tail current source 68 can be K, where K is a whole number such as 8. Transistor currents and sizes can similarly be ratioed.

Figure 6:
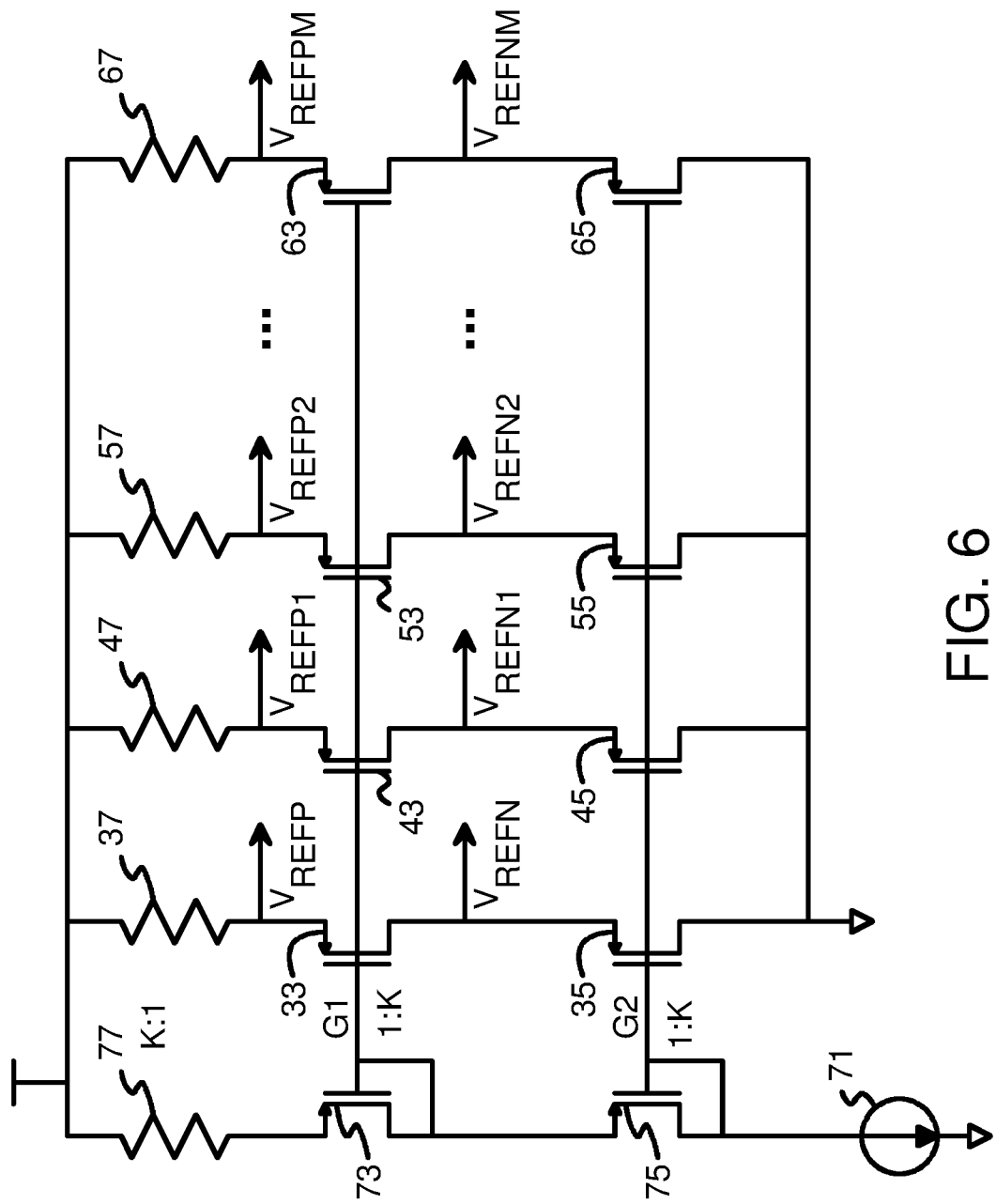
FIG. 6 is a p-channel self-biasing parallel multi-channel cascode Class-A differential reference buffer.

FIG. 6 is a p-channel self-biasing parallel multi-channel cascode Class-A differential reference buffer. The self-biasing leg has current sink 71 connected to ground and to the drain of p-channel transistor 75, which has its gate and drain connected together. As current is pulled through transistor 75 by current sink 71, the gate/drain voltage falls below the source voltage to turn on p-channel transistor 75 and generate a bias voltage on its gate/drain node G2.

The source of p-channel transistor 75 connects to the drain and gate of p-channel transistor 73, which also generates a higher bias voltage on its gate/drain node G2. Tail resistor 77 between the source of transistor 73 and the power supply generates a source voltage due to the IR drop as current flows through the self-biasing leg.

Gate nodes G1, G2 are thus directly generated from transistors 73, 75 in the self-biasing leg. Vrefp can then be generated at the source of p-channel source follower transistor 33 in the first leg, while Vrefn is generated at the source of p-channel source follower transistor 35 by the current flowing through tail resistor 37.

Other parallel legs of p-channel source follower transistors and tail resistors generate other pairs of references. Vrefp2 is generated at the source of p-channel source follower transistor 53 while Vrefn2 is generated at the source of p-channel source follower transistor 55. Vrefpm is generated at the source of p-channel source follower transistor 63 while Vrefnm is generated at the source of p-channel source follower transistor 65.

Vrefp, Vrefn can be higher voltages when using p-channel source followers. This may be beneficial in certain applications.

Figure 7:
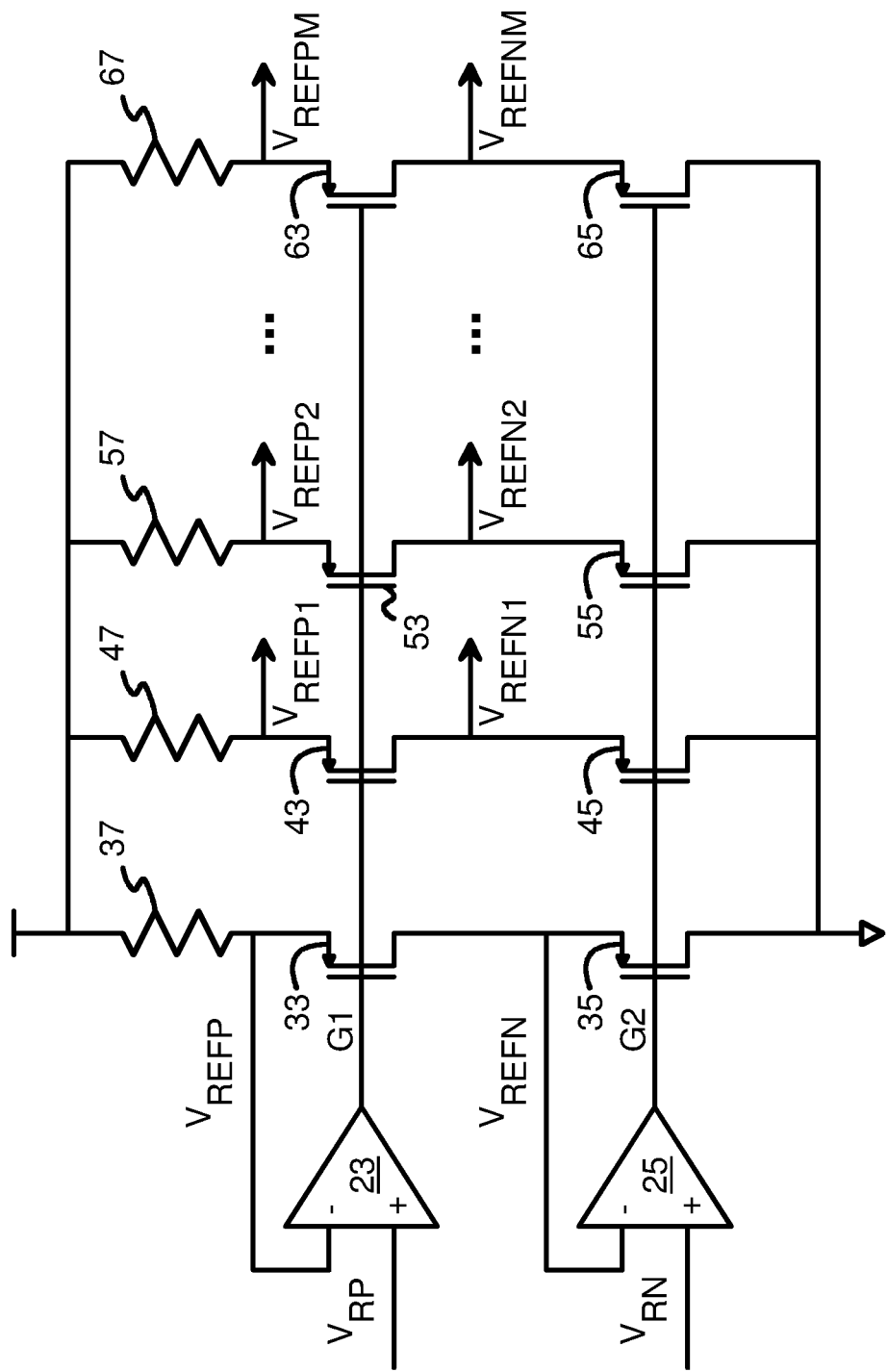
FIG. 7 is a p-channel parallel multi-channel cascode Class-A differential reference buffer.

FIG. 7 is a p-channel parallel multi-channel cascode Class-A differential reference buffer. Bandgap reference voltage Vrp is applied to the non-inverting + input of op amp 23 while the inverting − input of op amp 23 is driven by the source of p-channel source follower transistor 33, which is also reference voltage Vrefp. Resistor 37 between power and Vrefp provides and JR voltage drop to generate Vrefp. The output of op amp 23 drives gate node G1 to the gate of p-channel source follower transistors 33, 43, 53, 63 in the parallel legs.

P-channel source follower transistor 35 has its drain driven by ground, its gate driven by the output by op amp 25, node G2, and its source generating the reference Vrefn, which is also the drain of upper p-channel source follower transistor 33. Vrefn feeds back to the inverting − input of op amp 25, which also receives bandgap reference voltage Vrn at its non-inverting + input to generate G2 on its output. G2 drives the gates of p-channel source follower transistors 35, 45, 55, 65.

Source followers provide a low output impedance and high current drive. The negative feedback of op amps 23, 35 further reduces the output impedance of the p-channel source follower transistors 33, 35.

While reference nodes Vrefp, Vrefn generated by a first leg of source follower transistors 33, 35 provide a high current, this current can be mirrored to many parallel legs of source follower pairs to provide many parallel voltage references.

Other parallel legs of p-channel source follower transistors and resistors generate other pairs of references. Vrefp2 is generated at the source of p-channel source follower transistor 53 while Vrefn2 is generated at the source of p-channel source follower transistor 55. Vrefpm is generated at the source of p-channel source follower transistor 63 while Vrefnm is generated at the source of p-channel source follower transistor 65.

Figure 8:
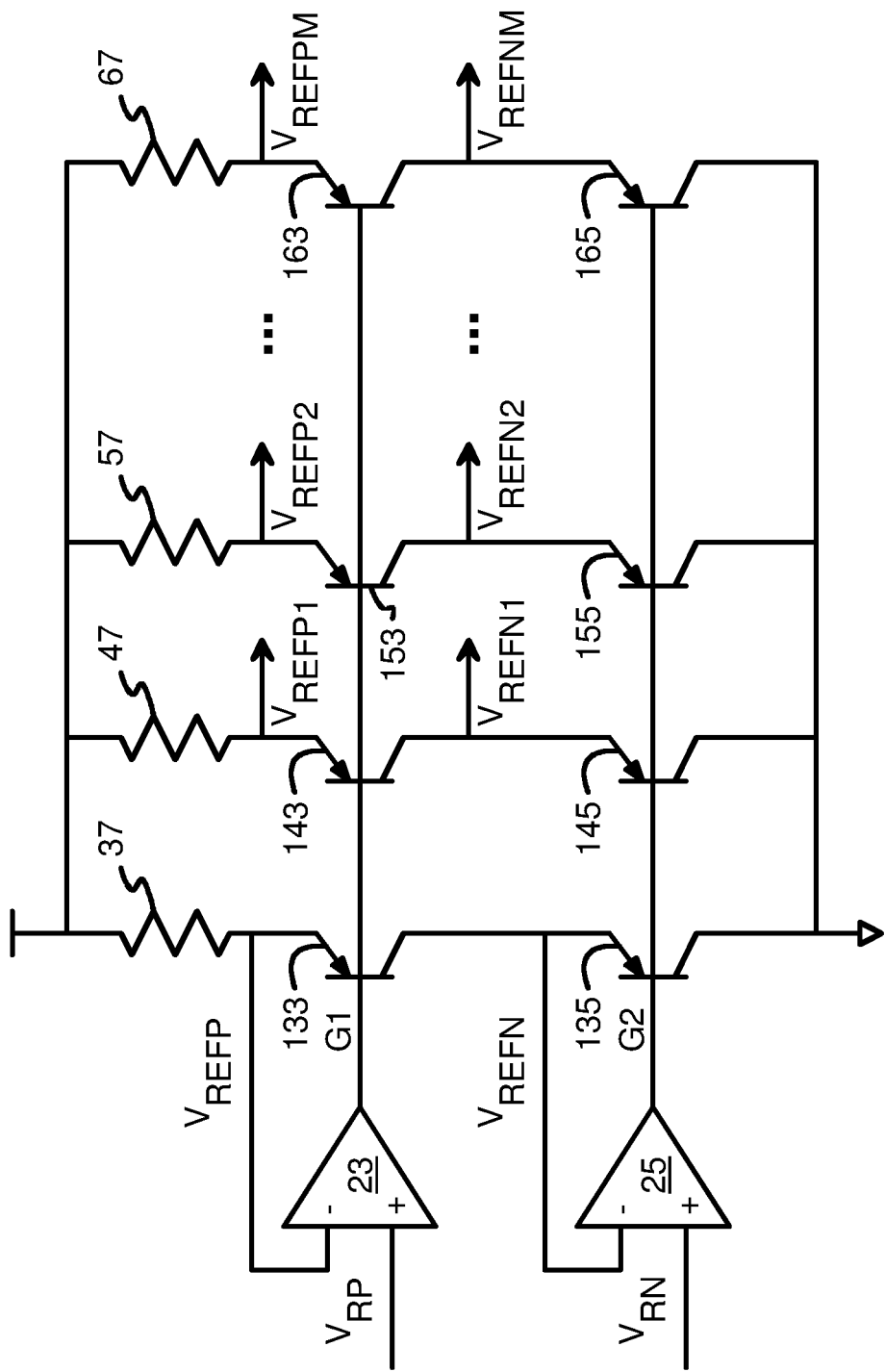
FIG. 8 a PNP bipolar parallel multi-channel cascode Class-A differential reference buffer.

FIG. 8 a PNP bipolar parallel multi-channel cascode Class-A differential reference buffer. Bandgap reference voltage Vrp is applied to the non-inverting + input of op amp 23 while the inverting − input of op amp 23 is driven by the emitter of PNP emitter follower transistor 133, which is also reference voltage Vrefp. Resistor 37 between power and Vrefp provides and IR voltage drop to generate Vrefp. The output of op amp 23 drives base node G1 to the base of PNP emitter follower transistors 133, 143, 153, 163 in the parallel legs.

PNP emitter follower transistor 135 has its collector grounded, its base driven by the output by op amp 25, node G2, and its emitter generating reference voltage Vrefn, which is also the collector of upper PNP emitter follower transistor 133. Vrefn feeds back to the inverting − input of op amp 25, which also receives bandgap reference voltage Vrn at its non-inverting + input to generate G2 on its output. G2 drives the bases of PNP emitter follower transistors 135, 145, 155, 165.

Emitter followers, like source followers, provide a low output impedance and high current drive. The negative feedback of op amps 23, 25 further reduces the output impedance of the PNP emitter follower transistors 133, 135.

While reference nodes Vrefp, Vrefn generated by a first leg of emitter follower transistors 133, 135 provide a high current, this current can be mirrored to many parallel legs of emitter follower pairs to provide many parallel voltage references.

Other parallel legs of PNP emitter follower transistors and resistors generate other pairs of references. Vrefp2 is generated at the emitter of PNP emitter follower transistor 153 while Vrefn2 is generated at the emitter of PNP emitter follower transistor 155. Vrefpm is generated at the emitter of PNP emitter follower transistor 163 while Vrefnm is generated at the emitter of PNP emitter follower transistor 165.

The NPN/PNP transistors can be made with a larger gain gm than for NMOS/PMOS transistors in mature technologies such as 180 nm. Some applications use BiCMOS with 180 nm. 130 nm nodes can use NPN or PNP to achieve lower output impedance of source followers. Other advantages are similar to those described for previous variations.

Figure 9:
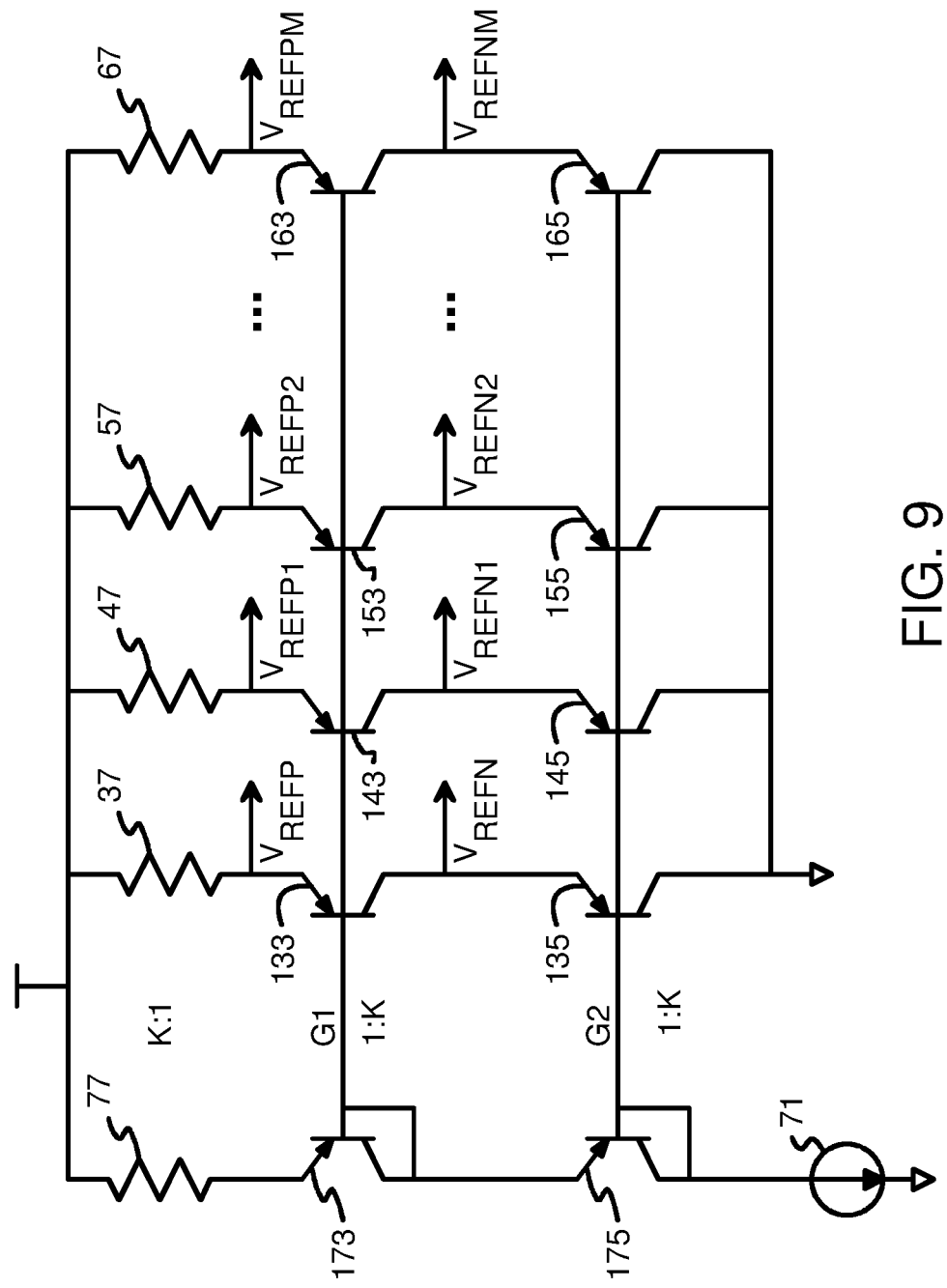
FIG. 9 is a PNP self-biasing parallel multi-channel cascode Class-A differential reference buffer.

FIG. 9 is a PNP self-biasing parallel multi-channel cascode Class-A differential reference buffer. The self-biasing leg has current sink 71 connected to ground and to the collector of PNP transistor 175, which has its base and collector connected together. As current is pulled through transistor 175 by current sink 71, the base/collector voltage falls below the emitter voltage to turn on PNP transistor 175 and generate a bias voltage on its base/collector node G2.

The emitter of PNP transistor 175 connects to the collector and base of PNP transistor 173, which also generates a higher bias voltage on its base/collector node G2. Resistor 77 between the emitter of transistor 173 and the power supply generates an emitter voltage due to the IR drop as current flows through the self-biasing leg.

Base nodes G1, G2 are thus directly generated from transistors 173, 175 in the self-biasing leg. Vrefp can then be generated at the emitter of PNP emitter follower transistor 133 in the first leg, while Vrefn is generated at the emitter of PNP emitter follower transistor 135 by the current flowing through resistor 37.

Other parallel legs of PNP emitter follower transistors and resistors generate other pairs of references. Vrefp2 is generated at the emitter of PNP emitter follower transistor 153 while Vrefn2 is generated at the emitter of PNP emitter follower transistor 155. Vrefpm is generated at the emitter of PNP emitter follower transistor 163 while Vrefnm is generated at the emitter of PNP emitter follower transistor 165.

The sizes of the transistors and resistors can be ratioed among legs to have different currents in the different legs. For example, the self-biasing leg can have a lower current than in the parallel legs that generate the voltage references to the ADC. When size of transistor 173 in the self-biasing leg is normalized to 1, then the size of transistors 133, 143, 153, 163 can be K, where K is a whole number such as 8. Then the current drive of transistor 132 driving Vref1 is K times the current drive of transistor 173.

Resistors can also be ratioed, but self-biasing leg resistor 77 is K times the resistance of each of resistor 37, 47, 57, 67. The lower resistance values allows for more current to flow in the parallel legs than in the self-biasing leg.

Figure 10:
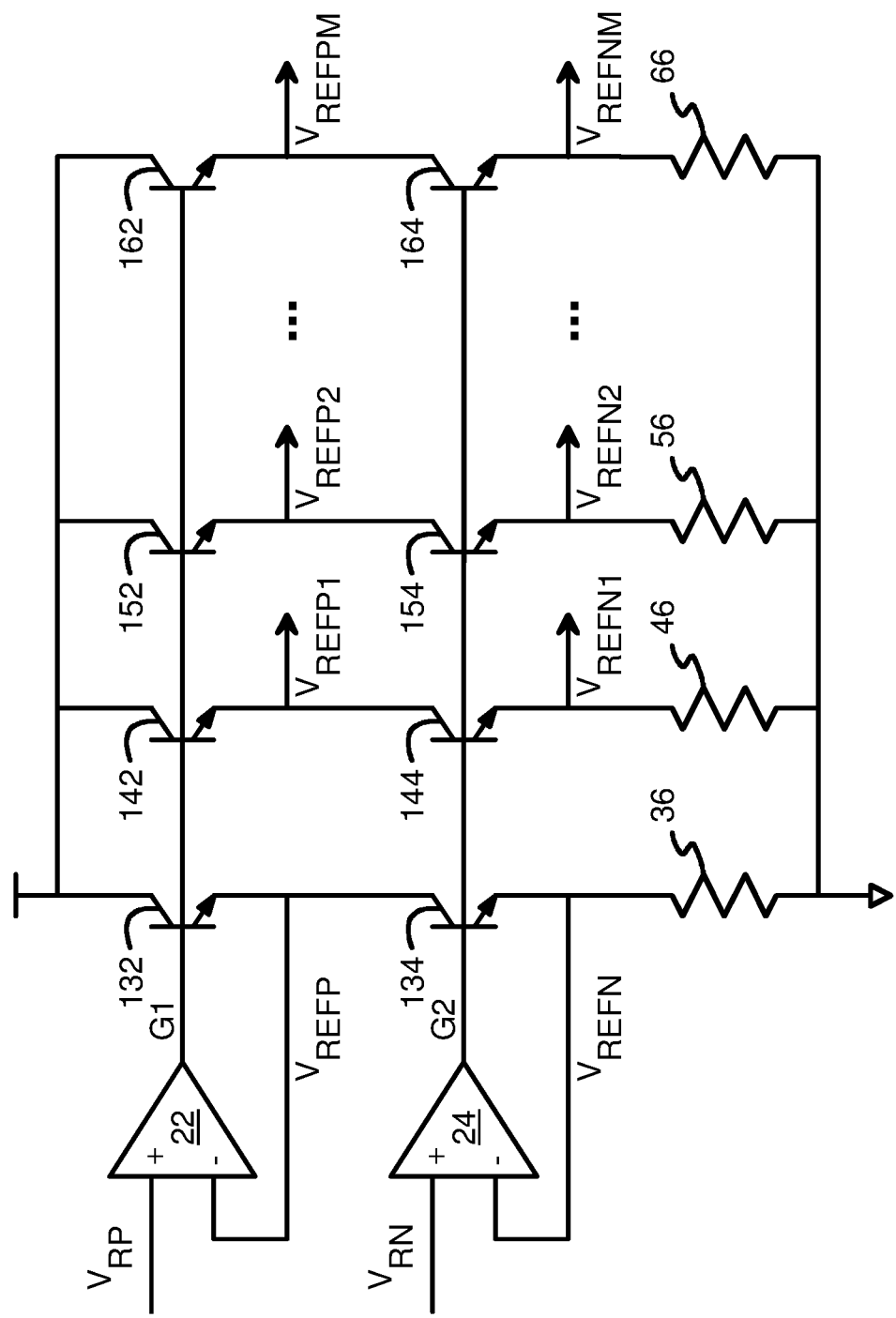
FIG. 10 is a schematic of a NPN parallel multi-channel cascode Class-A differential reference buffer.

FIG. 10 is a schematic of a NPN parallel multi-channel cascode Class-A differential reference buffer. Bandgap reference voltage Vrp is applied to the non-inverting + input of op amp 22 while the inverting − input of op amp 22 is driven by the emitter of transistor 132, Vrefp. Transistor 32 is an NPN bipolar transistor that has its collector driven by the power supply VDD, its base driven by the output by op amp 22, node G1, and its emitter generating the reference Vrefp. Transistor 32 is connected as an emitter-follower, with the Vrefp output generated by its emitter rather than its collector.

Lower reference Vrefn is also generates by an emitter follower. NPN transistor 134 has its collector connected to the upper reference Vrefp, and its emitter generates the lower reference Vrefn, which is fed back to the inverting − input of op amp 24. Op amp 24 receives the lower bandgap reference Vrn on its non-inverting + input and generates node G2 to the base of transistor 134. Tail resistor 36 connects the emitter of transistor 134, Vrefn, to ground.

Two emitter follower NPN transistors 132, 134 in series generate references Vrefp, Vrefn that have a low impedance and high current drive due to their emitter-follower configuration and the negative feedback to op amps 22, 24.

While reference nodes Vrefp, Vrefn generated by a first leg of emitter follower transistors 132, 134 provide a high current, this current can be mirrored to many parallel legs of emitter follower pairs to provide many parallel voltage references.

A second leg of emitter follower transistors 142, 144 and tail resistor 46 generate a second pair of voltage references Vrefp1, Vrefn1. The base of transistor 142 is driven by base node G1 output by op amp 22, while the base of transistor 144 is driven by base node G2 output by op amp 24, so emitter follower transistors 142, 144 benefit from the negative feedback in the first leg. Disturbances on its outputs Vrefp1, Vrefn1 cannot disturb this feedback in leg 1. Better isolation and signal rejection can be achieved using parallel legs.

In the third leg, emitter follower transistor 152 received base node G1 generated in the first leg, and has an emitter driving reference Vrefp2 that is also the collector of emitter follower transistor 154. Base node G2 drives the base of emitter follower transistor 154. The emitter of emitter follower transistor 154 drives a high current to reference Vrefn2 with low impedance. Trail resistor 56 biases the emitter of transistor 154.

Many other legs of emitter follower transistors 162, 164 and tail resistor 66 can be added, each having an upper emitter follower transistor 162 with a base receiving G1 and an emitter driving the upper reference Vrefpm to one or more of the ADC channels. Each leg also has a lower emitter follower transistor 164 with a base receiving G2 and a emitter driving the lower reference Vrefnm to the ADC channel.

Figure 11:
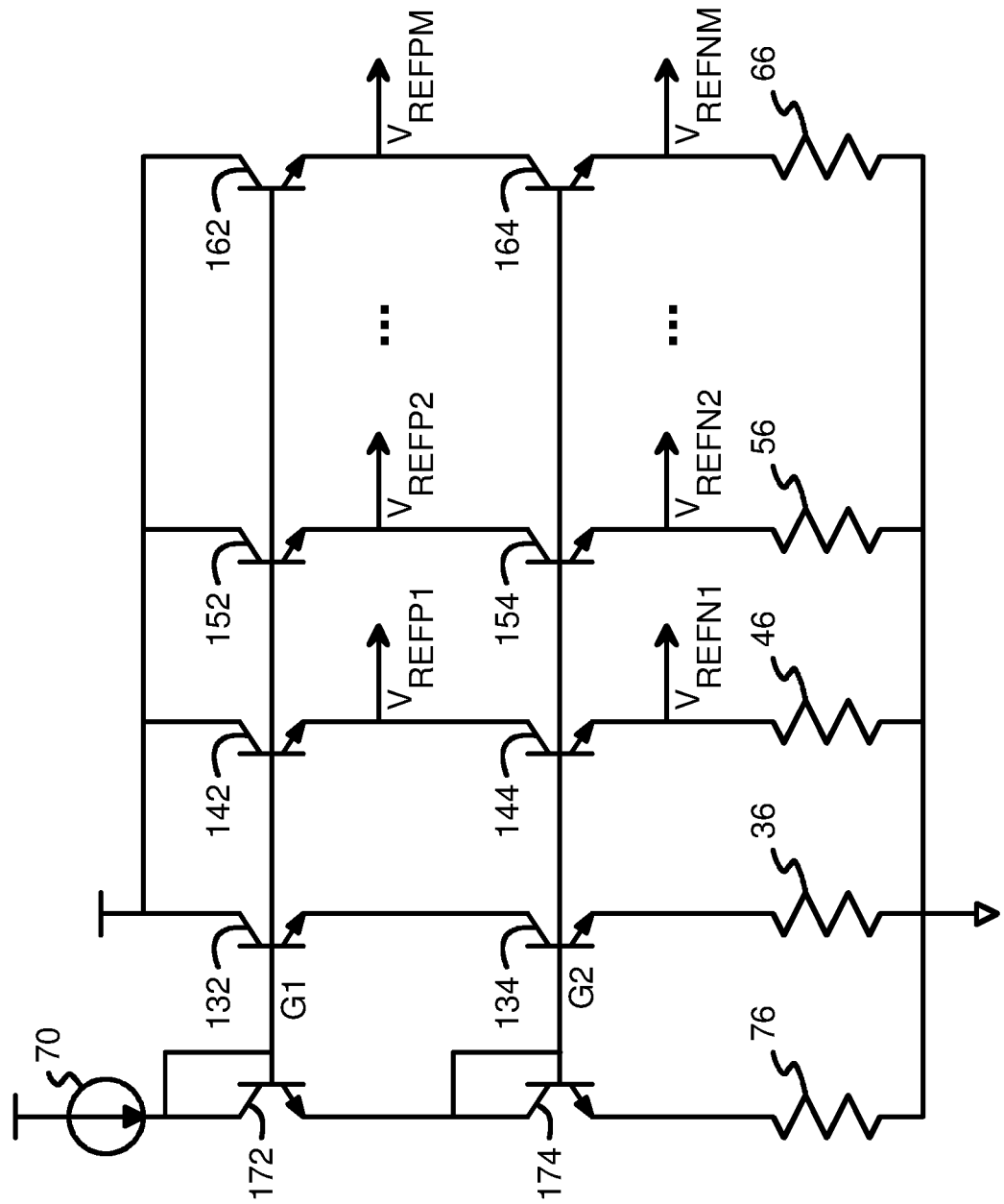
FIG. 11 is a schematic of an NPN self-biasing parallel multi-channel cascode Class-A differential reference buffer.

FIG. 11 is a schematic of an NPN self-biasing parallel multi-channel cascode Class-A differential reference buffer. Rather than use bandgap reference generator 102, internal voltage references are generated in a self-biasing leg.

The self-biasing leg has current source 70 connected to the power supply to drive the collector of NPN transistor 172, which has its base and collector connected together. As current is forced through transistor 172 by current source 70, the base/collector voltage rises above the emitter voltage to turn on transistor 172 and generate a bias voltage on its base/collector node G1.

The emitter of transistor 172 connects to the collector and base of transistor 174, which also generates a lower bias voltage on its base/collector node G2. Tail resistor 76 between the emitter of transistor 174 and ground generates an emitter voltage due to the IR drop as current flows through the self-biasing leg.

Base nodes G1, G2 are thus directly generated from transistors 172, 174 in the self-biasing leg. Vrefp can then be generated at the emitter of emitter follower transistor 132 in the first leg, while Vrefn is generated at the emitter of emitter follower transistor 134 by the tail current flowing through tail resistor 36.

Other parallel legs of emitter follower transistors and tail resistors generate other pairs of references. Vrefp2 is generated at the emitter of emitter follower transistor 152 while Vrefn2 is generated at the emitter of emitter follower transistor 154. Vrefpm is generated at the emitter of emitter follower transistor 162 while Vrefnm is generated at the emitter of emitter follower transistor 164.

The advantages and disadvantages of this circuit are similar to the NMOS implementation. A lower output impedance of the source followers can be achieved in traditional BiCMOS technologies. For some applications, NPN is better than NMOS since the gain gm is larger for the same device dimensions and its output impedance can be made smaller for the same current and size. The same output impedance can be designed for NPN and NMOS, but NPN can have a smaller device size for a given current.

Figure 12:
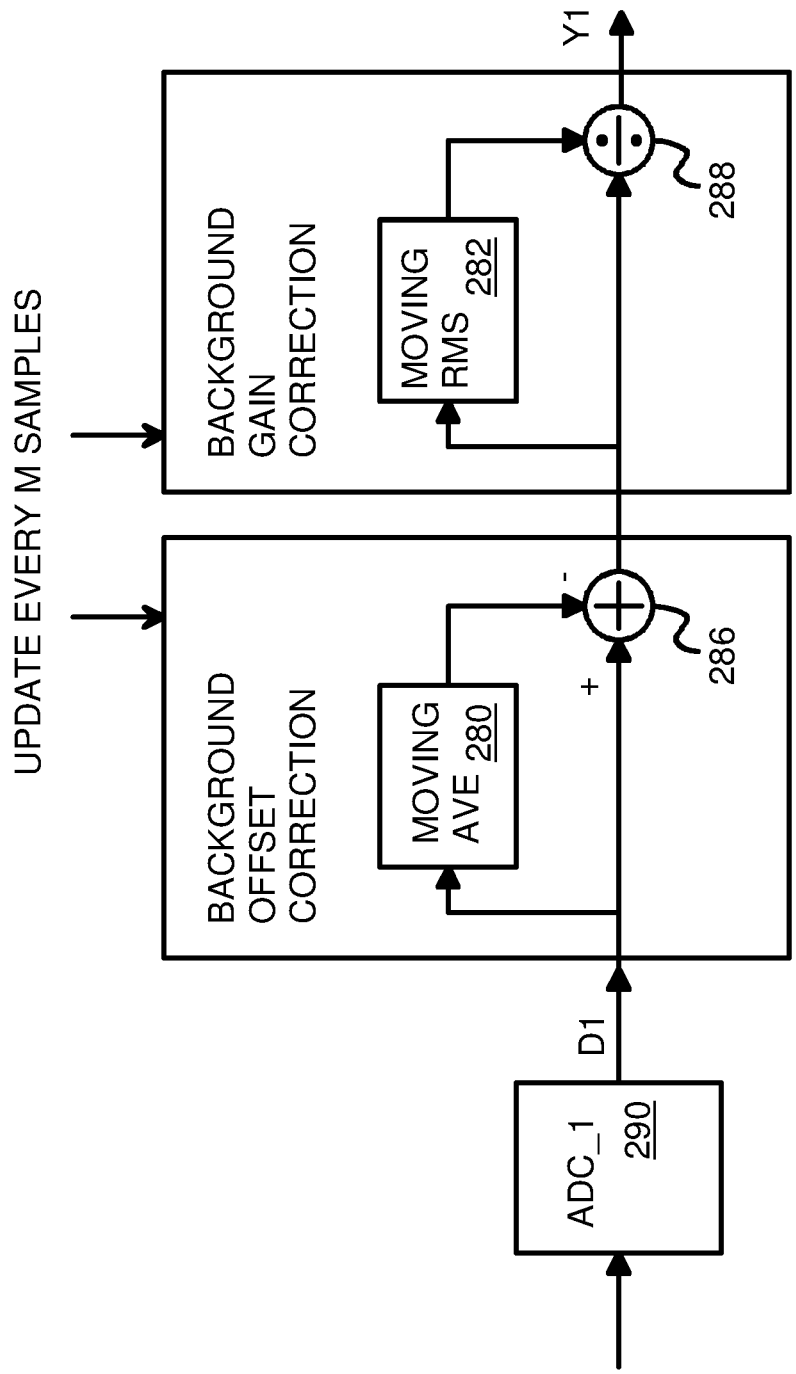
FIG. 12 shows background offset and gain correction.

FIG. 12 shows background offset and gain correction. Offset and gain mismatches caused by mismatches of the upper and lower voltage references generated by the circuits of FIGS. 2-11 can be corrected for by subtracting an average over M samples for each ADC channel. ADC 290 generates digital output D1 that has offset and gain mismatches. A moving average of D1 is generated by moving averager 280 over M samples, and this moving average is subtracted by subtractor 286 from D1.

A moving Root-Mean-Square (RMS) of D1 is generated over M samples by moving RMS generator 282, and the offset-corrected digital output D1 is divided by this moving rms value by divider 288 to generate normalized digital output Y1 for channel 1. Each channel is separately corrected for offset and gain in a similar manner. These are updated after every M samples. The reference voltage mismatches may be effectively aligned or compensated for using moving RMS generator 282 in a time-interleaved ADC manner.

Figure 13:
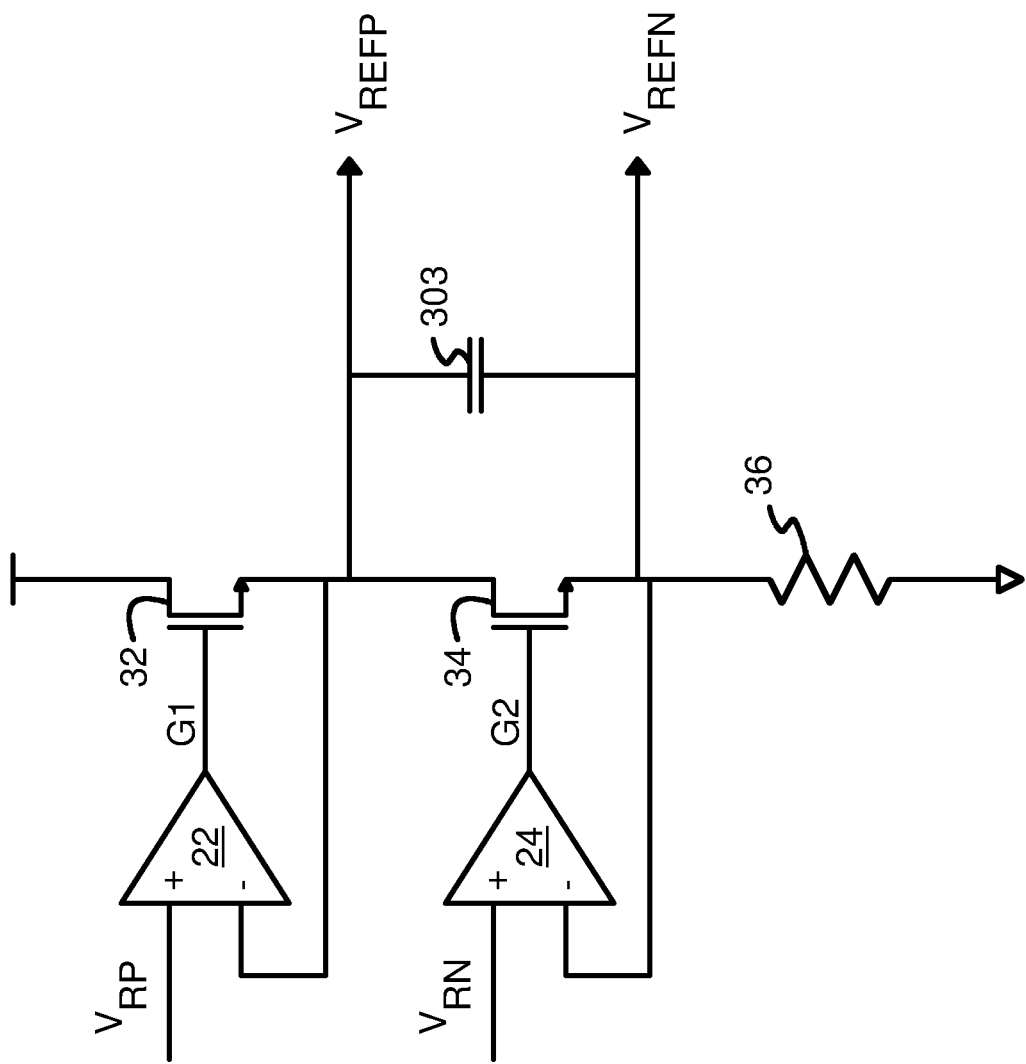
FIG. 13 shows using a large capacitor to supply reference charges refreshed by a cascode Class-A differential reference generator.

FIG. 13 shows using a large capacitor to supply reference charges refreshed by a cascode Class-A differential reference generator. Large reservoir capacitor 303 is added between Vrefp and Vrefn to supply reference charges to more than one channel. Every sampling cycle source follower transistors 32, 34 refresh the charge taken from reservoir capacitor 303 by the ADC channels. Reservoir capacitor 303 can be large enough to supply charge for multiple ADC channels, negating the need for multiple legs of source follower transistors. However, the size of large reservoir capacitor 303 may be greater than the aggregate size of leg source follower transistors 42, 52, 62, 44, 54, 64, . . . (FIG. 2), so using reservoir capacitor 303 may be more expensive than using multiple leg source follower transistors.

ALTERNATE EMBODIMENTS

Several other embodiments are contemplated by the inventor. For example level shifters may be added, such as between the core reference buffer and the multiple ADC channels. The voltage levels assigned to power and ground may be shifted, so that the common-mode or middle of the supply range is defined as ground with a positive and a negative supply terminals, where the negative supply terminal is the old ground.

Terms such as up, down, upper, lower, etc. are relative and are not meant to be limiting. The upper voltage could be a lower voltage than the lower voltage in some alternate embodiments as an example.

While n-channel Metal-Oxide-Semiconductor Field-Effect Transistor (MOSFETs) and NPN bipolar transistors, as well as p-channel and PNP transistors, have been described, as transistor process technology advances, there may be other kinds of transistors that can be substituted, such as Fin Field-Effect Transistor (FinFET), or Junction FET (JFET).

Current sources could be approximated or implemented as transistors having gate and drains connected together, or depletion mode transistors or native transistors. Self-biasing such as in FIGS. 4-6, 9, 11 may be less accurate than using bandgap reference voltages, but the accuracy may be sufficient for some applications as long as the minimum gate-to-source voltage Vgs covers the maximum analog input swing Vinp-Vinn.

An emitter follower can be considered to be a type of source follower configuration for bipolar transistors. A bipolar transistor base can be considered to be a transistor control gate that controls current conduction in the channel through the base between the collector and emitter. The emitter is roughly equivalent to the source of a MOS transistor while the collector can be thought of as the drain.

The number of legs, each generating a pair of voltage references, may be varied, such as having 4 legs, 8 legs, 32 legs, etc. A simple system might have only 1 leg. Vrefp from transistor 32 and Vrefn from transistor 34 (FIG. 2) could be output to be used as voltage references in the downstream load device, or they could be internal references that are not output. Transistors 32, 34 could be considered the initial leg, or leg 0. Having parallel legs and references allows an ADC to avoid crosstalk among ADC channels, interference, while still operating at high speed.

The low output impedance of the source follower reference generators reduces crosstalk, kickback, and signal dependency in downstream load devices such as an ADC. A higher sampling rate can be supported. Low output noise and a ripple error of less than half of the LSB of the ADC may be achieved. Less dependency on supply fluctuations and a high Power Supply Rejection Ratio (PSRR) can be achieved with the source follower circuits of FIGS. 2-11. The reference voltage range can match the core ADC's power supply range. Low power consumption and a multi-channel implementation are supported.

Ripple error can be further reduced by adding a large capacitor between Vrefp and Vrefn. For example, a 100 pF reservoir capacitor could be added.

Using n-channel or NPN transistors allows Vrefn to be close to ground. For example, Vrefn=0.25 v and Vrefp=0.75 v can be used with an ADC having a power supply of 0.9 v. This cannot be achieved using a p-channel and an n-channel transistor in series rather than the 2 source follower n-channel transistors of FIG. 2. For p-channel or PNP transistors, Vrefn can be 0.5 v and Vrefp=1.0 volt when the ADC has a 1 v power supply.

The number of samples averaged M could be different for foreground and background calibration and could even differ for different capacitor bit-positions, such as more samples for LSB's that are more sensitive and fewer samples for MSBs. M could also differ for other reasons such as varying voltage or temperature conditions.

The number of channels N in an interleaved ADC can be binary, non-binary, even or odd. While 4 channel interleaving has been shown in detail, 8-channel, 7-channel, 6-channel, 16-channel, 32-channel, or N-channel interleaved ADC's may be substituted. The interleave order of the channels may be changed. Interleaving may be nested or may be one long loop at level 1.

While an interleaved ADC has been described as a load device that uses the parallel voltage references generated, other load devices could be used, such as DAC's.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. Capacitors may be connected together in parallel to create larger capacitors that have the same fringing or perimeter effects across several capacitor sizes. Switches could be n-channel transistors, p-channel transistors, or transmission gates with parallel n-channel and p-channel transistors, or more complex circuits, either passive or active, amplifying or non-amplifying.

The number of ADC digital bits may be adjusted. For example, a 15-bit ADC could be used, or an 8-bit, 6-bit, 22-bit, or 18-bit. A different number of bits could be substituted for a different precision, and the number of bits could be fixed or could be variable.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A reference buffer comprising:
an upper source follower transistor having a first channel conducting current to a first node in response to an upper gate node;
a lower source follower transistor having a second channel conducting current to a second node in response to a lower gate node;
a tail device for limiting current;
a series connection, between a power supply and a ground, of the first channel of the upper source follower transistor, the second channel of the lower source follower transistor, and the tail device;
wherein the upper source follower transistor and the lower source follower transistor are of a same type of transistor and of a same polarity of transistor;
wherein the upper source follower transistor is connected in a source follower configuration wherein a first voltage of the first node varies in response to the upper gate node;
wherein the lower source follower transistor is connected in the source follower configuration wherein a second voltage of the second node varies in response to the lower gate node;
a first control generator for generating an upper control voltage on the upper gate node;
a second control generator for generating a lower control voltage on the lower gate node;
a plurality of legs in parallel, each leg for generating an upper reference voltage and a lower reference voltage, each leg comprising:
a leg upper source follower transistor having a leg first channel conducting current to a leg first node in response to the upper control voltage on the upper gate node;
a leg lower source follower transistor having a leg second channel conducting current to a leg second node in response to the lower control voltage on the lower gate node;
a leg tail device for limiting current in the leg; and
a leg series connection, between the power supply and the ground, of the leg first channel of the leg upper source follower transistor, the leg second channel of the leg lower source follower transistor, and the leg tail device;

wherein the leg upper source follower transistor and the leg lower source follower transistor are of the same type of transistor and of the same polarity of transistor;

wherein the leg upper source follower transistor is connected in the source follower configuration wherein the leg first node has the upper reference voltage that varies in response to the upper control voltage;

wherein the leg lower source follower transistor is connected in the source follower configuration wherein the leg second node has the lower reference voltage that varies in response to the lower control voltage;

whereby two source follower transistors in series generate two reference voltages for each leg.

2. The reference buffer of claim 1 wherein the first control generator comprises:

a first op amp having an output driving the upper gate node with the upper control voltage in response to a first bandgap voltage applied to a non-inverting input and the first node applied to an inverting input of the first op amp;

wherein the second control generator comprises:

a second op amp having an output driving the lower gate node with the lower control voltage in response to a second bandgap voltage applied to a non-inverting input and the second node applied to an inverting input of the second op amp;

wherein the first bandgap voltage and the second bandgap voltage are each generated by a bandgap reference generator that uses a bandgap device to generate reference voltages that are independent of temperature and supply voltage fluctuations;

wherein the first node is isolated from the upper reference voltage and from the lower reference voltage generated by legs in the plurality of legs in parallel;

wherein the second node is isolated from the upper reference voltage and from the lower reference voltage generated by legs in the plurality of legs in parallel;

whereby negative feedback to the inverting input lowers output impedance of generated reference voltages.

3. The reference buffer of claim 2 wherein the upper source follower transistor comprises an n-channel Metal-Oxide-Semiconductor Field-Effect Transistor (MOSFET) having a drain connected to the power supply and a source connected to the first node;

wherein the lower source follower transistor comprises an n-channel MOSFET having a drain connected to the first node and a source connected to the second node;

wherein the tail device is connected between the second node and the ground;

wherein the leg upper source follower transistor comprises an n-channel MOSFET having a drain connected to the power supply and a source connected to the leg first node;

wherein the leg lower source follower transistor comprises an n-channel MOSFET having a drain connected to the leg first node and a source connected to the leg second node;

wherein the leg tail device is connected between the leg second node and the ground.

4. The reference buffer of claim 3 wherein the tail device and the leg tail device each comprise a resistor.

5. The reference buffer of claim 3 wherein the tail device and the leg tail device each comprise a current source.

6. The reference buffer of claim 2 wherein the upper source follower transistor comprises a p-channel Metal-Oxide-Semiconductor Field-Effect Transistor (MOSFET) having a drain connected to the second node and a source connected to the first node;

wherein the lower source follower transistor comprises an p-channel MOSFET having a drain connected to the ground and a source connected to the second node;

wherein the tail device is connected between the first node and the power supply;

wherein the leg upper source follower transistor comprises an p-channel MOSFET having a drain connected to the leg second node and a source connected to the leg first node;

wherein the leg lower source follower transistor comprises an p-channel MOSFET having a drain connected to the ground and a source connected to the leg second node;

wherein the leg tail device is connected between the leg first node and the power supply.

7. The reference buffer of claim 6 wherein the tail device and the leg tail device each comprise a resistor or a current source.

8. The reference buffer of claim 2 wherein the upper source follower transistor comprises an NPN bipolar transistor having a collector connected to the power supply and an emitter connected to the first node;

wherein the lower source follower transistor comprises an NPN bipolar transistor having a collector connected to the first node and an emitter connected to the second node;

wherein the tail device comprises a resistor connected between the second node and the ground;

wherein the leg upper source follower transistor comprises an NPN bipolar transistor having a collector connected to the power supply and an emitter connected to the leg first node;

wherein the leg lower source follower transistor comprises an NPN bipolar transistor having a collector connected to the leg first node and an emitter connected to the leg second node;

wherein the leg tail device comprises a resistor connected between the leg second node and the ground.

9. The reference buffer of claim 2 wherein the upper source follower transistor comprises a PNP bipolar transistor having a collector connected to the second node and an emitter connected to the first node;

wherein the lower source follower transistor comprises an PNP bipolar transistor having a collector connected to the ground and an emitter connected to the second node;

wherein the tail device comprises a resistor connected between the first node and the power supply;

wherein the leg upper source follower transistor comprises an PNP bipolar transistor having a collector connected to the leg second node and an emitter connected to the leg first node;

wherein the leg lower source follower transistor comprises an PNP bipolar transistor having a collector connected to the ground and an emitter connected to the leg second node;

wherein the leg tail device comprises a resistor connected between the leg first node and the power supply.

10. The reference buffer of claim 1 wherein the first control generator comprises:

a first self-biasing transistor having a gate and a drain connected together and to the upper gate node to control current in a first self-biasing channel;

a second self-biasing transistor having a gate and a drain connected together and to the lower gate node to control current in a second self-biasing channel;

a self-biasing tail device for limiting current;

a current source;

wherein the current source, the first self-biasing channel, the second self-biasing channel, and the self-biasing tail device are connected in series between the power supply and the ground.

11. The reference buffer of claim 10 wherein the upper source follower transistor comprises an n-channel Metal-Oxide-Semiconductor Field-Effect Transistor (MOSFET) having a drain connected to the power supply and a source connected to the first node;

wherein the lower source follower transistor comprises an n-channel MOSFET having a drain connected to the first node and a source connected to the second node;

wherein the tail device is connected between the second node and the ground;

wherein the leg upper source follower transistor comprises an n-channel MOSFET having a drain connected to the power supply and a source connected to the leg first node;

wherein the leg lower source follower transistor comprises an n-channel MOSFET having a drain connected to the leg first node and a source connected to the leg second node;

wherein the leg tail device is connected between the leg second node and the ground;

wherein the first self-biasing transistor and the second self-biasing transistor each comprise an n-channel transistor wherein a source of the first self-biasing transistor is connected to the drain of the second self-biasing transistor.

12. The reference buffer of claim 10 wherein the upper source follower transistor comprises a p-channel Metal-Oxide-Semiconductor Field-Effect Transistor (MOSFET) having a drain connected to the second node and a source connected to the first node;

wherein the lower source follower transistor comprises an p-channel MOSFET having a drain connected to the ground and a source connected to the second node;

wherein the tail device is connected between the first node and the power supply;

wherein the leg upper source follower transistor comprises an p-channel MOSFET having a drain connected to the leg second node and a source connected to the leg first node;

wherein the leg lower source follower transistor comprises an p-channel MOSFET having a drain connected to the ground and a source connected to the leg second node;

wherein the leg tail device is connected between the leg first node and the power supply;

wherein the first self-biasing transistor and the second self-biasing transistor each comprise a p-channel transistor wherein a source of the second self-biasing transistor is connected to the drain of the first self-biasing transistor.

13. The reference buffer of claim 10 wherein the upper source follower transistor comprises an NPN bipolar transistor having a collector connected to the power supply and an emitter connected to the first node;

wherein the lower source follower transistor comprises an NPN bipolar transistor having a collector connected to the first node and an emitter connected to the second node;

wherein the tail device comprises a resistor connected between the second node and the ground;

wherein the leg upper source follower transistor comprises an NPN bipolar transistor having a collector connected to the power supply and an emitter connected to the leg first node;

wherein the leg lower source follower transistor comprises an NPN bipolar transistor having a collector connected to the leg first node and an emitter connected to the leg second node;

wherein the leg tail device comprises a resistor connected between the leg second node and the ground;

wherein the first self-biasing transistor and the second self-biasing transistor each comprise an NPN bipolar transistor each having a base and a collector connected together, wherein the emitter of the first self-biasing transistor is connected to the collector of the second self-biasing transistor.

14. The reference buffer of claim 10 wherein the upper source follower transistor comprises a PNP bipolar transistor having a collector connected to the second node and an emitter connected to the first node;

wherein the lower source follower transistor comprises an PNP bipolar transistor having a collector connected to the ground and an emitter connected to the second node;

wherein the tail device comprises a resistor connected between the first node and the power supply;

wherein the leg upper source follower transistor comprises an PNP bipolar transistor having a collector connected to the leg second node and an emitter connected to the leg first node;

wherein the leg lower source follower transistor comprises an PNP bipolar transistor having a collector connected to the ground and an emitter connected to the leg second node;

wherein the leg tail device comprises a resistor connected between the leg first node and the power supply;

wherein the first self-biasing transistor and the second self-biasing transistor each comprise an NPN bipolar transistor each having a base and a collector connected together, wherein the emitter of the second self-biasing transistor is connected to the collector of the first self-biasing transistor.

15. A reference-voltage buffer comprising:

a first bandgap input for receiving a first bandgap reference voltage generated by a bandgap reference generator;

a second bandgap input for receiving a second bandgap reference voltage generated by a bandgap reference generator;

a first op amp having a non-inverting input connected to the first bandgap input, having an inverting input connected to a first node, and generating an output on a first control node;

a first n-channel transistor having a gate connected to the first control node, a drain connected to a power supply node, and a source connected to the first node;

a second op amp having a non-inverting input connected to the second bandgap input, having an inverting input connected to a second node, and generating an output on a second control node;

a second n-channel transistor having a gate connected to the second control node, a drain connected to the first node, and a source connected to the second node;

a tail device connecting the second node to a ground node, the tail device being a resistor or a current source;

a plurality of legs, each leg comprising:
a leg first n-channel transistor having a gate connected to the first control node, a drain connected to the power supply node, and a source connected to an upper reference-voltage node;

a leg second n-channel transistor having a gate connected to the second control node, a drain connected to the upper reference-voltage node, and a source connected to a lower reference-voltage node; and a leg tail device connecting the upper reference-voltage node to the ground node, the leg tail device being a resistor or a current source;

wherein the upper reference-voltage node carries an upper reference voltage for use by a portion of a load device and the lower reference-voltage node carries a lower reference voltage for use by the portion of the load device.

16. The reference-voltage buffer of claim 15 wherein the load device is an interleaved Analog-to-Digital Converter (ADC) having a plurality of sub-ADC operating in parallel, each sub-ADC for converting an analog input sampled during a different time slot to a digital value for that time slot;

wherein the portion of the load device is a sub-ADC;

wherein the plurality of legs of the reference-voltage buffer each drive an upper reference voltage and a lower reference voltage to a sub-ADC.

17. The reference-voltage buffer of claim 16 further comprising:

a plurality of portions of the load device, each portion comprising:
a plurality of weighted capacitors;
a plurality of upper switches to the plurality of weighted capacitors, wherein each upper switch in the plurality of upper switches receives the upper reference voltage and is able to switch the upper reference voltage to a weighted capacitor in the plurality of weighted capacitors;
a plurality of lower switches to the plurality of weighted capacitors, wherein each lower switch in the plurality of lower switches receives the lower reference voltage and is able to switch the lower reference voltage to a weighted capacitor in the plurality of weighted capacitors.

18. The reference-voltage buffer of claim 17 further comprising for each sub-ADC:

a background offset corrector that averages the digital value output for a channel from the sub-ADC to generate a moving average that is subtracted from the digital value output to generate an offset-corrected digital output;

a gain corrector that generates a moving root-mean-square of the offset-corrected digital output for the channel.

19. A reference generator comprising:

a current source connected between a power supply and a first control node;

a first control NPN transistor having a collector and a base connected together at the first control node, and an emitter connected to a second control node;

a second control NPN transistor having a collector and a base connected together at the second control node, and an emitter connected to a tail node;

a control tail resistor connected between the tail node and a ground;

a first bias-generating NPN transistor having a collector connected to the power supply, a base connected to the first control node, and an emitter connected to a first upper voltage reference node;

a second bias-generating NPN transistor having a collector connected to the first upper voltage reference node, a base connected to the second control node, and an emitter connected to a first lower voltage reference node; and a bias-generating tail resistor connected between the first lower voltage reference node and the ground;

a reservoir capacitor connected between the first upper voltage reference node and the second upper voltage reference node;

wherein the first upper voltage reference node and the first lower voltage reference node are output as voltage references.

20. The reference generator of claim 19 further comprising:

a plurality of legs, each leg comprising:
a leg upper bias-generating NPN transistor having a collector connected to the power supply, a base connected to the first control node, and an emitter connected to a leg upper voltage reference node;
a leg lower bias-generating NPN transistor having a collector connected to the leg upper voltage reference node, a base connected to the second control node, and an emitter connected to a leg lower voltage reference node; and
a leg tail resistor connected between the leg lower voltage reference node and the ground;

wherein the leg upper voltage reference node and the leg lower voltage reference node are output as voltage references for each leg in the plurality of legs.

* * * * *